(12) United States Patent
Choi et al.

(10) Patent No.: US 12,731,625 B2
(45) Date of Patent: Sep. 8, 2026

(54) MEMORY DEVICE RELATED TO A READ VOLTAGE AND AN OPERATION METHOD OF THE MEMORY DEVICE

(71) Applicant: SK hynix Inc., Icheon-si (KR)

(72) Inventors: Won Jae Choi, Icheon-si (KR); Sang Sik Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 104 days.

(21) Appl. No.: 18/775,541

(22) Filed: Jul. 17, 2024

(65) Prior Publication Data

US 2025/0349332 A1 Nov. 13, 2025

(30) Foreign Application Priority Data

May 10, 2024 (KR) ........................ 10-2024-0061563

(51) Int. Cl.
*G11C 8/08* (2006.01)
*G11C 8/10* (2006.01)
*G11C 29/52* (2006.01)

(52) U.S. Cl.
CPC .................. *G11C 8/08* (2013.01); *G11C 8/10* (2013.01); *G11C 29/52* (2013.01)

(58) Field of Classification Search
CPC ........... G11C 8/08; G11C 8/10; G11C 29/021; G11C 29/028; G11C 29/52
See application file for complete search history.

(56) References Cited

U.S. PATENT DOCUMENTS

| | | | | |
|---|---|---|---|---|
| 10,910,067 | B2 | 2/2021 | Tokutomi et al. | |
| 2017/0162270 | A1* | 6/2017 | Park | G11C 29/021 |
| 2020/0202952 | A1* | 6/2020 | Lee | G11C 16/3495 |
| 2023/0153198 | A1* | 5/2023 | Huang | G06F 3/0679 714/723 |

FOREIGN PATENT DOCUMENTS

| | | | | |
|---|---|---|---|---|
| KR | 1020230012640 A | | 1/2023 | |
| WO | WO-2020237637 A1 | * | 12/2020 | G11C 16/26 |

* cited by examiner

*Primary Examiner* — Woo H Choi
(74) *Attorney, Agent, or Firm* — WILLIAM PARK AND ASSOCIATES LTD.

(57) ABSTRACT

A memory device including: a plurality of word lines; a plurality of memory cells connected to each of the plurality of word lines, respectively; control logic configured to, based on an optimal read voltage value of a first word line among the plurality of word lines and an optimal read voltage value of a second word line among the plurality of word lines, calculates optimal read voltage values of word lines located between the first word line and the second word line by applying a position-based linear value; and a row decoder configured to apply the optimal read voltage value calculated by the control logic to a word line selected from the plurality of word lines.

14 Claims, 8 Drawing Sheets

FIG. 7

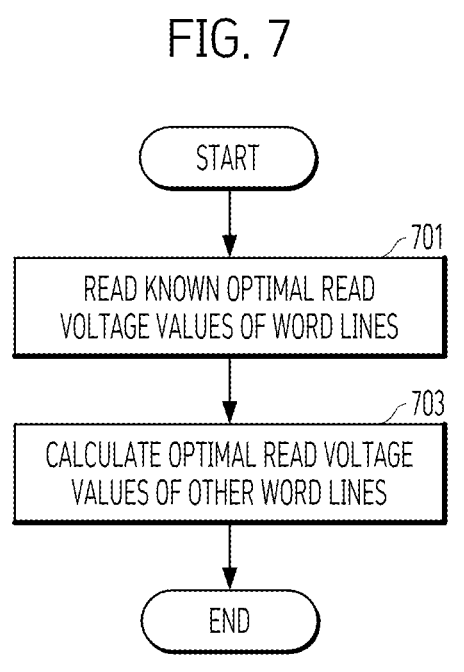

START

701

READ KNOWN OPTIMAL READ VOLTAGE VALUES OF WORD LINES

703

CALCULATE OPTIMAL READ VOLTAGE VALUES OF OTHER WORD LINES

END

MEMORY DEVICE RELATED TO A READ VOLTAGE AND AN OPERATION METHOD OF THE MEMORY DEVICE

CROSS-REFERENCE TO RELATED APPLICATION

The present application claims priority under 35 U.S.C. § 119 (a) to Korean Patent Application No. 10-2024-0061563 filed in the Korean Intellectual Property Office on May 10, 2024, which application is incorporated herein by reference in its entirety.

BACKGROUND

1. Technical Field

Embodiments of the present disclosure generally relate to a memory device, and more particularly, to a memory device related to a read voltage and an operation method of the memory device.

2. Related Art

A memory device is a device that stores data under the control of a host device such as a computer and a smart phone. The memory device is divided into a volatile memory device and a nonvolatile memory device. The volatile memory device is a memory device that stores data only when power is supplied and loses the stored data when no power is supplied. The volatile memory device includes static random access memory (SRAM), dynamic random access memory (DRAM), and the like. The nonvolatile memory device is a memory device that loses no data even when power is cut off, and includes read only memory (ROM), programmable ROM (PROM), electrically programmable ROM (EPROM), electrically erasable and programmable ROM (EEPROM), flash memory, and the like.

A read operation is an operation of reading data stored in a memory device. Specifically, the read operation is an operation of applying a read voltage to a selected word line and applying a pass voltage to an unselected word line. In order to accurately perform a read operation, a technology is required to accurately set the level of the voltage applied to the word line.

SUMMARY

In an embodiment, a memory device may include: a plurality of word lines; a plurality of memory cells connected to each of the plurality of word lines, respectively; control logic configured to, based on an optimal read voltage value of a first word line among the plurality of word lines and an optimal read voltage value of a second word line among the plurality of word lines, calculate optimal read voltage values of word lines located between the first word line and the second word line by applying a position-based linear value; and a row decoder configured to apply the optimal read voltage value calculated by the control logic to a word line selected from the plurality of word lines.

In an embodiment, an operation method of a memory device may include: reading an optimal read voltage value of a first word line; reading an optimal read voltage value of a second word line; based on the optimal read voltage value of the first word line and the optimal read voltage value of the second word line, calculating an optimal read voltage value of a third word line located between the first word line and the second word line by applying a position-based linear value; and performing a read operation of reading data from memory cells connected to the third word line by using the optimal read voltage value of the third word line.

BRIEF DESCRIPTION OF THE DRAWINGS

FIG. 7 is a diagram illustrating an embodiment of a process by which the memory device calculates an optimal read voltage value.

DETAILED DESCRIPTION

Various embodiments are directed to a technology for optimally setting a read voltage of a memory device.

In accordance with embodiments of the present disclosure, a read voltage of a memory device can be set as an optimal value.

Hereafter, embodiments in accordance with the technical spirit of the present disclosure will be described with reference to the accompanying drawings. It will be understood that although the terms first, second, third etc. may be used herein to describe various elements, these elements should not be limited by these terms. These terms are only used to distinguish one element from another element, but not used to define only the element itself or to mean a particular sequence.

Figure 1:
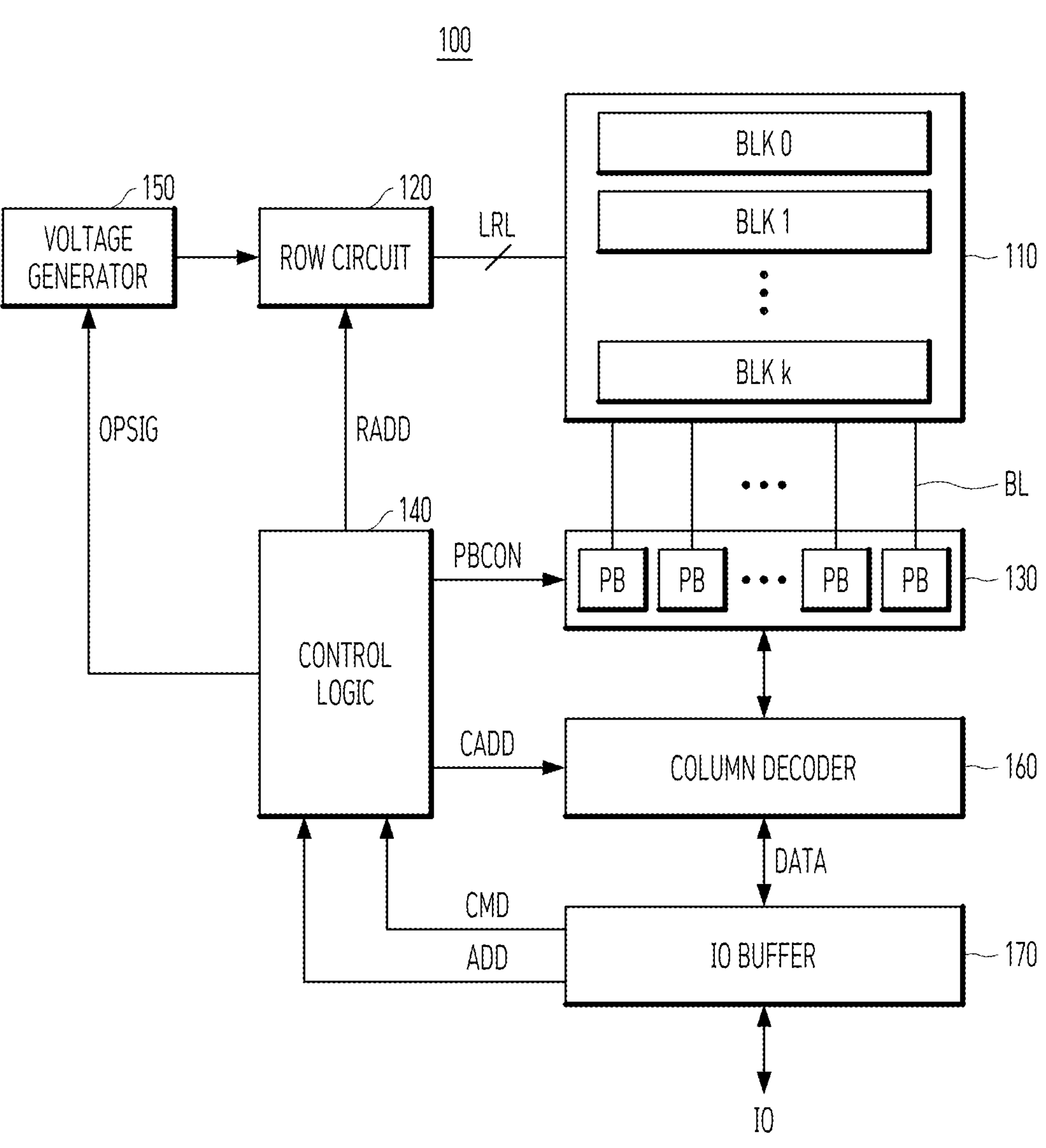
FIG. 1 is a configuration diagram of a memory device in accordance with an embodiment of the present disclosure.

FIG. 1 is a configuration diagram of a memory device in accordance with an embodiment of the present disclosure.

Referring to FIG. 1, the memory device 100 includes a memory cell array 110, a row decoder 120, a page buffer circuit 130, control logic 140, a voltage generator 150, a column decoder 160, and an input/output (IO) buffer 170. In an embodiment, the row decoder 120 may be implemented as hardware, software, or a combination of hardware and software. For example, the row decoder 120 may be a row decoder circuit operating in accordance with an algorithm and/or a processor executing row decoder code. In an embodiment, the column decoder 160 may be implemented as hardware, software, or a combination of hardware and software. For example, the column decoder 160 may be a column decoder circuit operating in accordance with an algorithm and/or a processor executing column decoder code. In an embodiment, the control logic 140 may be implemented as hardware, software, or a combination of hardware and software. For example, the control logic 140 may be a control logic circuit operating in accordance with an algorithm and/or a processor executing control logic code. In an embodiment, the voltage generator 150 may be implemented as hardware, software, or a combination of hardware and software. For example, the voltage generator 150 may be a voltage generator circuit operating in accordance with the operation control signal to provide various voltages to the row decoder 120.

In an embodiment, the IO buffer 170 communicates with a memory controller through input/output lines IO. The IO buffer 170 transmits a command CMD and addresses ADD received through the input/output lines IO to the control logic 140, and transmits received data DATA to the column decoder 160. The IO buffer 170 also transmits data DATA read from the memory cell array 110 to the memory controller through the input/output lines IO.

In an embodiment, the memory cell array 110 includes a plurality of memory blocks BLK0 to BLKk. Each of the memory blocks BLK0 to BLKk includes a plurality of memory strings. Each of the memory strings includes a plurality of memory cells stacked on a substrate. In an embodiment, the memory cells are nonvolatile memory cells.

In an embodiment, the memory cell array 110 includes a content addressable memory (CAM) area. The CAM area includes a plurality of memory cells included in at least one memory block. The CAM area stores various setting information necessary for an operation of the memory device 100. For example, the CAM area stores the number of executions of program/erase (P/E Cycle) and information on a defective area in the memory cell array 110. The CAM area also stores option information necessary for the memory device 100 to operate, for example, program voltage information, read voltage information, erase voltage information, and the like. When power is supplied to the memory device 100, that is, during an initial operation of the memory device 100, the information stored in the CAM area is read, and the control logic 140 controls the operation of the memory device 100 by using the information read from the CAM area.

In an embodiment, the memory cell array 110 is connected to the row decoder 120 through local row lines LRL. The local row lines LRL include at least one drain select line, a plurality of word lines, and at least one source select line. The memory cell array 110 is connected to the page buffer circuit 130 through bit lines BL. The local row line LRL is provided for each of memory blocks BLK0 to BLKk, and a local row line LRL of a memory block selected from the memory blocks BLK0 to BLKk is controlled by being electrically connected to global row lines of the row decoder 120. The bit lines BL are commonly connected to the memory blocks BLK0 to BLKk.

In an embodiment, the row decoder 120 decodes the row address RADD transmitted from the control logic 140, and selects one of the memory blocks BLK0 to BLKk of the memory cell array 110. Subsequently, the row decoder 120 transmits operating voltages provided from the voltage generator 150 to local low lines LRL of the selected memory block. In an embodiment, the row decoder 120 may be configured to apply the operating voltages to the drain select lines, the word lines, the source select lines, and the source line which are coupled to the selected memory block depending on a row address RADD.

In an embodiment, the page buffer circuit 130 includes a plurality of page buffers PB connected to the memory cell array 110 through the bit lines BL. The page buffer PB operates as a write driver or a sense amplifier depending on an operation mode. During a program operation, the page buffers PB latch data DATA transmitted through the IO buffer 170 and the column decoder 160, and apply, to the bit lines BL, a voltage required for storing the data DATA in memory cells selected in response to a page buffer control signal PBCON from the control logic 140. During a read operation, the page buffers PB read the data DATA stored in the selected memory cells through the bit lines BL, and output the read data DATA to the outside of the memory device 100 through the column decoder 160 and the IO buffer 170. During an erase operation, the page buffers PB cause the bit lines BL of the memory cell array 110 to float.

In an embodiment, the control logic 140 transmits a row address RADD among the addresses ADD received through the IO buffer 170 to the row decoder 120, and transmits a column address CADD to the column decoder 160. The control logic 140 controls the page buffer circuit 130 and the voltage generator 150 to access memory cells selected in response to the command CMD received through the IO buffer 170. In the drawing, the page buffer control signal PBCON represents control signals for controlling the page buffer circuit 130, and an operation control signal OPSIG represents control signals for controlling the voltage generator 150.

In an embodiment, the voltage generator 150 generates various voltages required by the memory device 100. For example, the voltage generator 150 is configured to generate program voltages, pass voltages, read voltages, and the like. The levels of the voltages generated by the voltage generator 150 are controlled by the operation control signal OPSIG.

In an embodiment, the column decoder 160 responds to the column address CADD transmitted from the control logic 140, transmits the data DATA to the page buffer circuit 130 during a program operation, and receives the data DATA from the page buffer circuit 130 during a read operation.

Figure 2:
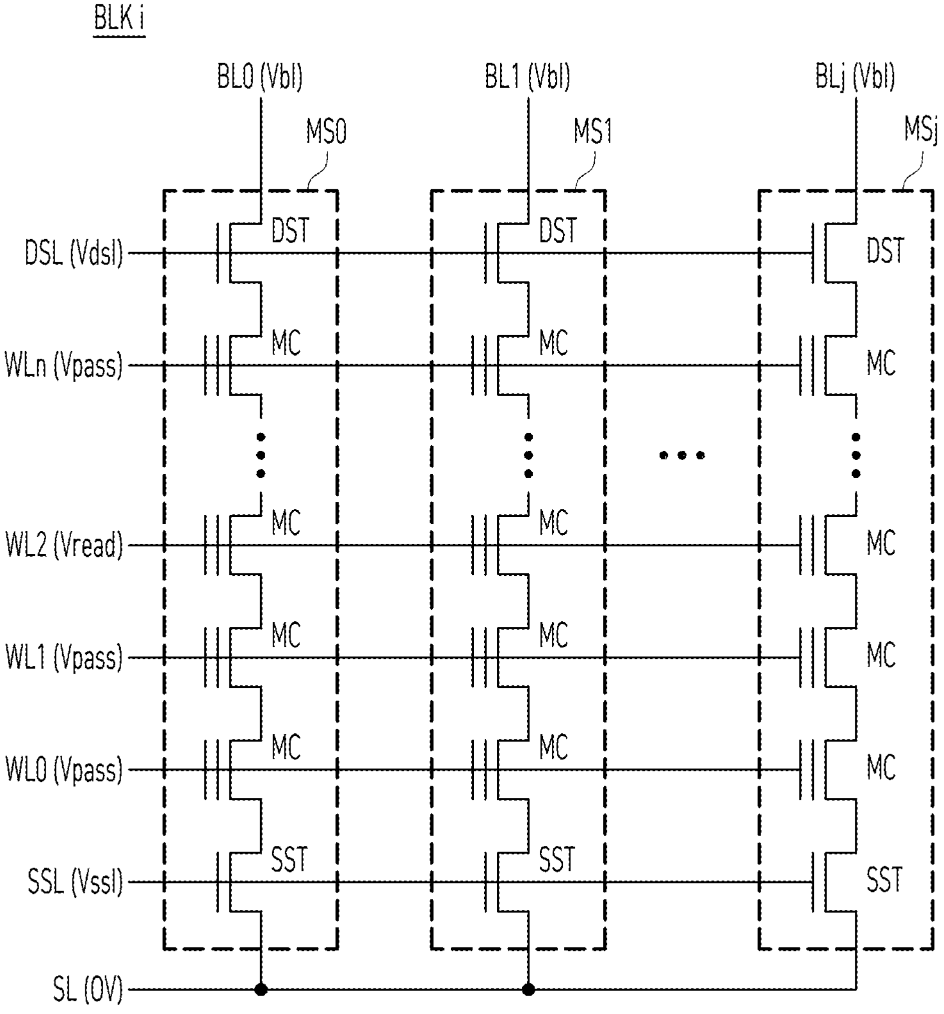
FIG. 2 is a configuration diagram of an embodiment of a memory block BLKi (i is an integer from 0 to k) in FIG. 1.

FIG. 2 is a configuration diagram of an embodiment of a memory block BLKi (i is an integer from 0 to k) in FIG. 1.

Referring to FIG. 2, the memory block BLKi includes a plurality of memory strings MS0 to MSj.

In an embodiment, each of the memory strings MS0 to MSj includes a source select transistor SST, memory cells MC, and a drain select transistor DST connected between a source line SL and bit lines BL0 to BLj. The source select transistor SST controls electrical connections between the memory strings MS0 to MSj and the source line SL according to the control of a source select line SSL, and the drain select transistor DST controls electrical connections between the memory strings MS0 to MSj and the bit lines BL0 to BLj according to the control of a drain select line DSL. The memory cells MC are controlled by word lines WL0 to WLn.

In an embodiment, the memory strings MS0 to MSj are controlled by the same source select line SSL, word lines WL0 to WLn, and drain select line DSL.

In an embodiment, parentheses written alongside the lines DSL, WL0 to WLn, SSL, and SL in FIG. 2 indicate voltages applied to the lines DSL, WL0 to WLn, SSL, and SL during a read operation of memory cells MC corresponding to the word line WL2. Referring to FIG. 2, a ground voltage of 0 V is supplied to the source line SL, and a voltage Vssl for turning on the source select transistor SST is applied to the source select line SSL, so that the memory strings MS0 to MSj and the source line SL are electrically connected. In a state in which the bit lines BL0 to BLj are precharged to the level of a precharge voltage Vbl, a voltage Vdsl for turning on the drain select transistor DST is applied to the drain select line, so that the memory strings MS0 to MSj and the bit lines BL0 to BLj are electrically connected. A pass voltage Vpass is applied to the unselected word lines WL0, WL1, and WL3 to WLn to turn on unselected memory cells MC, and a read voltage Vread is applied to the selected word line WL2, so that selected memory cells MC are turned on/off according to the level of a threshold voltage of the selected memory cells MC (according to stored data). When the selected memory cells MC connected to the word line WL2 are turned on, the voltage levels of the bit lines BL0 to BLj are changed from the level of the precharge voltage Vbl to the level of the ground voltage of 0 V, and when the selected memory cells MC are turned off, the voltage levels of the bit lines BL0 to BLj maintain the level of the precharge voltage Vbl, so that changes in the voltages of the bit lines BL0 to BLj are checked to sense data stored in the selected memory cells MC.

Figure 3:
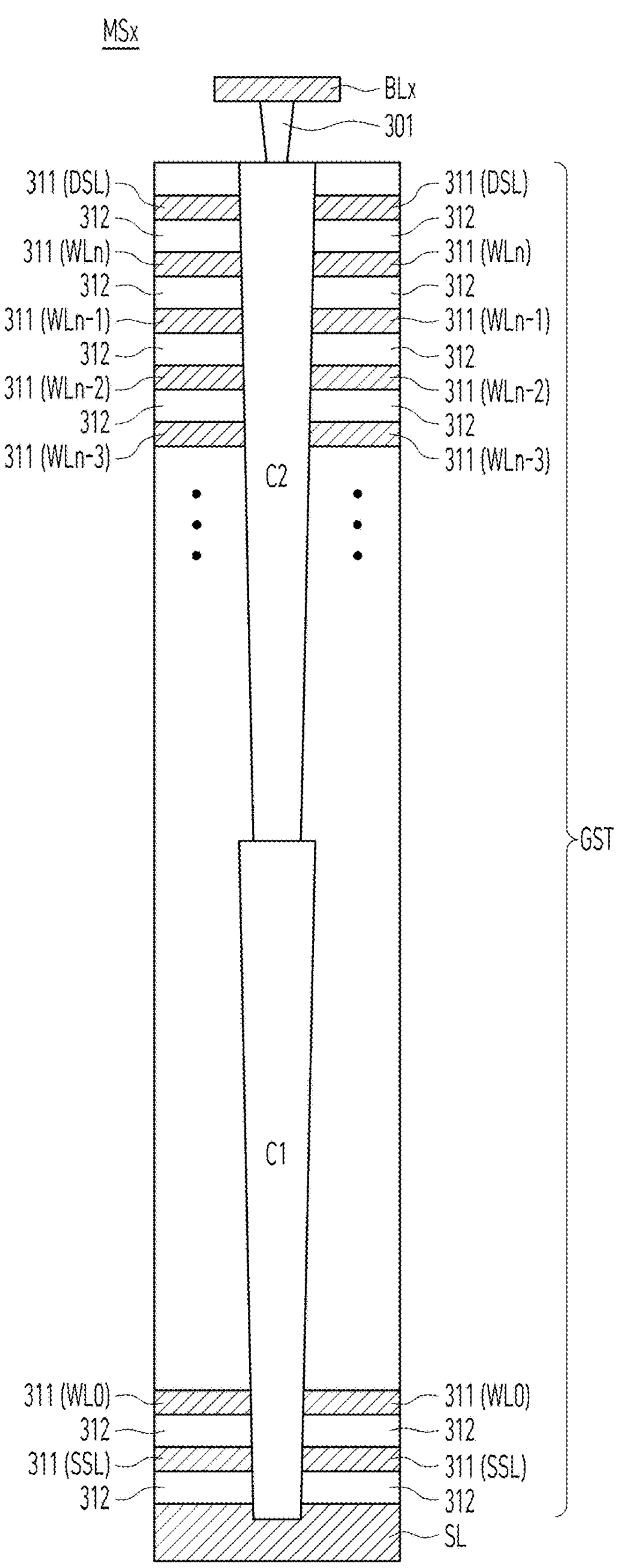
FIG. 3 is a diagram illustrating an embodiment of the physical structure of a memory string MSx (x is an integer from 0 to j) in FIG. 2.

FIG. 3 is a diagram illustrating an embodiment of the physical structure of the memory string MSx (x is an integer from 0 to j) in FIG. 2.

Referring to FIG. 3, the memory string MSx includes a gate structure GST, plugs C1 and C2, a contact 301, a source line SL, and a bit line BLx.

In an embodiment, the gate structure GST includes conductive films 311 and insulating films 312 that are alternately stacked. The conductive films 311 are gate lines such as the word line WL or the select lines DSL and SSL. In an embodiment, among the conductive films 311, at least one conductive film 311 at the lowermost portion is the source select line SSL, and at least one conductive film 311 at the uppermost portion is the drain select line DSL, and the remaining conductive films are word lines. Based on FIG. 3, lines on the left and lines on the right of the plugs C1 and C2 are the same lines.

In an embodiment, the contact 301 connects the plug C2 to the bit line BLx.

In an embodiment, the plugs C1 and C2 are located within an opening of the gate structure GST. Because the number of word lines WL is large, that is, the number of stacked memory cells is large, the plugs C1 and C2 are formed in two layers as shown in the drawing instead of one layer.

In an embodiment, plug shapes of the plugs C1 and C2 inevitably have different hole sizes at the top and bottom thereof due to the characteristics of an etching process. It can be seen that the size of the hole at the top of the plug C1 is larger than the size of the hole at the bottom thereof, and the size of the hole at the top of the plug C2 is also larger than the size of the hole at the bottom thereof. The fact that the sizes of the holes at the top and bottom of the plugs C1 and C2 are different means that the sizes of the memory cells MC at the top and bottom of the plugs C1 and C2 are different, which means that the characteristics of the memory cells MC are changed, and thus means that the level of the read voltage Vread also needs be changed.

That is, it means that the level of the read voltage Vread applied to the word line WL when (large-sized) memory cells MC at the top of the plugs C1 and C2 are read needs be different from the level of the read voltage Vread applied to the word line WL when (small-sized) memory cells at the bottom of the plugs C1 and C2 are read.

In an embodiment, because the sizes of the memory cells MC connected to each of the word lines WL0 to WLn are different, all the levels of optimal read voltages to be applied to the word lines WL0 to WLn during a read operation are different. For example, the level of an optimal read voltage to be applied to the word line WL0 during a read operation of memory cells connected to the word line WL0 is different from the level of an optimal read voltage to be applied to the word line WL15 during a read operation of memory cells connected to the word line WL15. The following describes methods for, from known optimal read voltage values of some word lines, linearly calculating optimal read voltage values of the remaining word lines.

For convenience of explanation, it is assumed that 120 word lines WL0 to WL119 are provided in the memory string MSx, 60 word lines WL0 to WL59 thereof are formed in the plug C1, and 60 word lines WL60 to WL119 thereof are formed in the plug C2.

Figure 4:
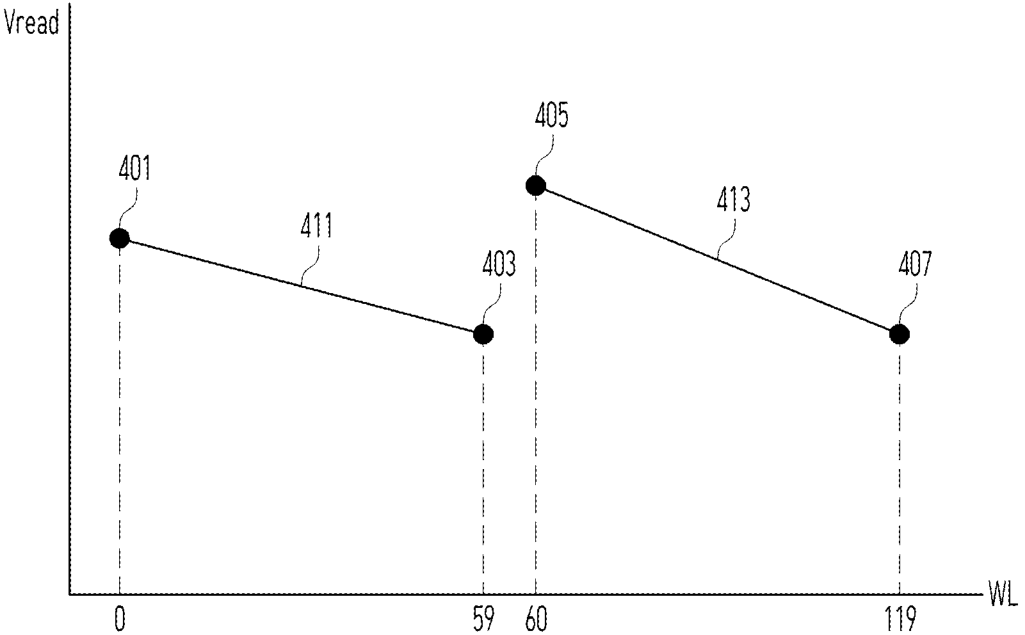
FIG. 4 is a diagram for explaining an embodiment of a method for calculating an optimal read voltage value.
Figure 5:
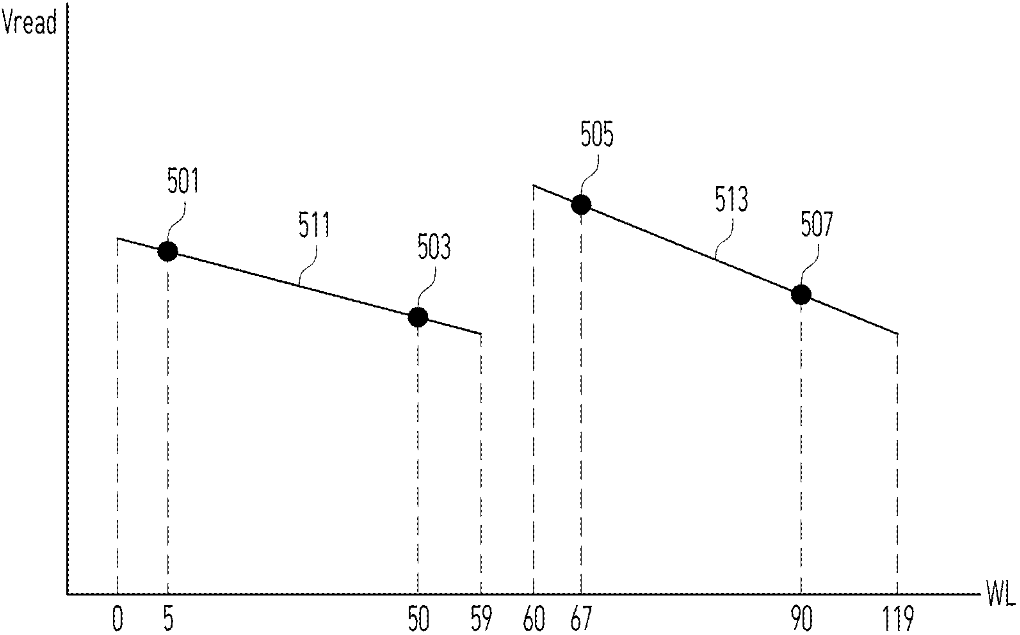
FIG. 5 is a diagram for explaining an embodiment of a method for calculating an optimal read voltage value.

In FIGS. 4 to 5 below, we will explore methods for calculating the optimal read voltage values of wordlines located between already known wordlines. These calculations are based on the optimal read voltage values of the already known wordlines, applying a position-based linear value.

FIG. 4 is a diagram for explaining an embodiment of a method for calculating an optimal read voltage value.

Referring to FIG. 4, values 401, 403, 405, and 407 represent already known optimal read voltage values. In an embodiment, the read voltage value 401 is a read voltage value of the word line WL0, and the read voltage value 403 is a read voltage value of the word line WL59. The read voltage value 405 is a read voltage value of the word line WL60, and the read voltage value 407 is a read voltage value of the word line WL119.

In an embodiment, a line 411 is drawable by connecting the read voltage value 401 and the read voltage value 403, and a line 413 is drawable by connecting the read voltage value 405 and the read voltage value 407. Because the plug C1 has a shape in which the hole size decreases linearly with height and the plug C2 also has a shape in which the hole size decreases linearly with height, it is possible to draw such lines 411 and 413.

In an embodiment, the line 411 is a line representing optimal read voltage values of the word lines WL1 to WL58 between the word lines WL0 and WL59. That is, the read voltage values of the word lines WL1 to WL58 are linearly calculated using the line 411. For example, a read voltage value Vread_WLx of a word line WLx (x is an integer from 1 to 58) is calculated as in Equation 1 below.

$$\text{Vread\_WLx} = \text{Vread\_WL59} + [(59 - x)/59] * (\text{Vread\_WL0} - \text{Vread\_WL59}) \quad \text{Equation 1}$$

In Equation 1 above, Vread_WL59 represents the optimal read voltage value of the word line WL59, and Vread_WL0 represents the optimal read voltage value of the word line WL0.

In an embodiment, the line 413 is a line representing optimal read voltage values of the word lines WL61 to WL118 between the word lines WL60 and WL119. That is, the read voltage values of the word lines WL61 to WL118 are linearly calculated using the line 413. For example, a read voltage value Vread_WLy of a word line WLy (y is an integer from 61 to 118) is calculated as in Equation 2 below.

$$\text{Vread\_WLy} = \text{Vread\_WL119} + [(119 - y)/59] * (\text{Vread\_WL60} - \text{Vread\_WL119}) \quad \text{Equation 2}$$

In Equation 2 above, Vread119 represents the optimal read voltage value of the word line WL119, and Vread_WL60 represents the optimal read voltage value of the word line WL60.

By using the lines 411 and 413 connecting the already known optimal values 401, 403, 405, and 407 of the read voltages of the word lines WL0, WL59, WL60, and WL119, unknown optimal values of read voltages of the word lines WL1 to WL58 and WL61 to WL118 are calculated.

FIG. 5 is a diagram for explaining an embodiment of a method for calculating an optimal read voltage value.

Referring to FIG. 5, values 501, 503, 505, and 507 represent already known optimal read voltage values. In an embodiment, the read voltage value 501 is a read voltage value of the word line WL5, the read voltage value 503 is a read voltage value of the word line WL50, the read voltage value 505 is a read voltage value of the word line WL67, and the read voltage value 507 is a read voltage value of the word line WL90.

In an embodiment, a line 511 is drawable by connecting the read voltage value 501 and the read voltage value 503. The line 511 is drawable to extend to the word line WL0 and the word line WL59 that are the area of the plug C1. By using the line 511, it is possible to linearly calculate the read voltage values of the word lines WL0 to WL4, WL6 to WL49, and WL51 to WL59.

In an embodiment, a line 513 is drawable by connecting the read voltage value 505 and the read voltage value 507. The line 513 is drawable to extend to the word line WL60 and the word line WL119 that are the area of the plug C2. By using the line 513, it is possible to linearly calculate the read voltage values of the word lines WL60 to WL66, WL68 to WL89, and WL91 to WL119.

As in FIG. 4, also in FIG. 5, by using the lines 511 and 513 connecting and extending the already known optimal values 501, 503, 505 and 507 of the read voltages of the word lines WL5, WL50, WL67 and WL90, unknown optimal values of the read voltages of the word lines WL60 to WL66, WL68 to WL89, and WL91 to WL119 are calculated.

Figure 6:
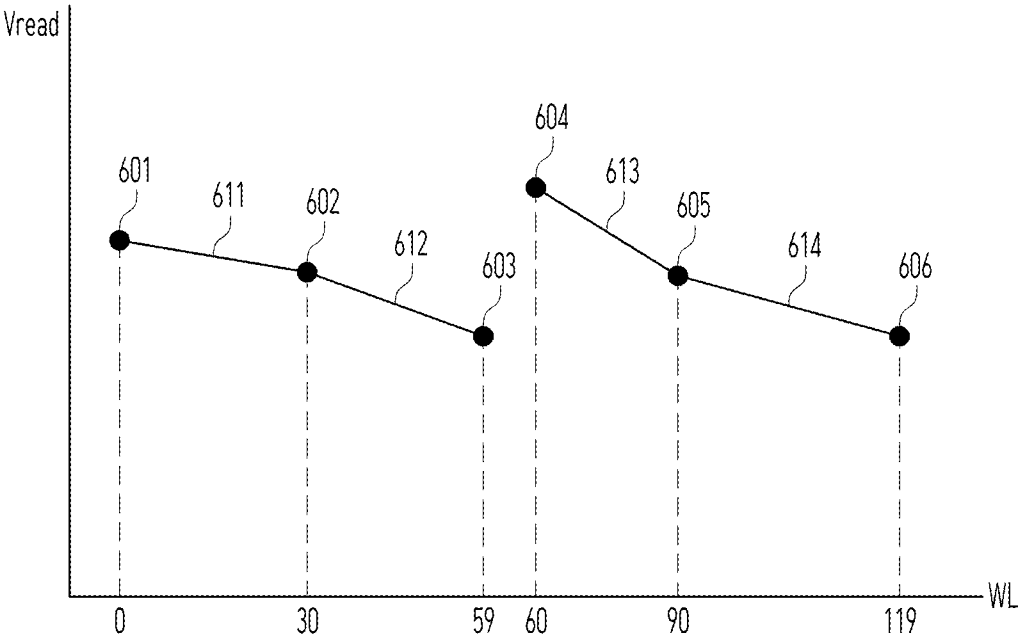
FIG. 6 is a diagram for explaining an embodiment of a method for calculating an optimal read voltage value.

FIG. 6 is a diagram for explaining an embodiment of a method for calculating an optimal read voltage value.

Referring to FIG. 6, values 601 to 606 represent already known optimal read voltage values. In an embodiment, the read voltage value 601 is a read voltage value of the word line WL0, the read voltage value 602 is a read voltage value of the word line WL30, and the read voltage value 603 is a read voltage value of the word line WL59. The read voltage value 604 is a read voltage value of the word line WL60, the read voltage value 605 is a read voltage value of the word line WL90, and the read voltage value 606 is a read voltage value of the word line WL119.

In an embodiment, a line 611 is drawable by connecting the read voltage value 601 and the read voltage value 602, and a line 612 is drawable by connecting the read voltage value 602 and the read voltage value 603. By using the line 611, it is possible to linearly calculate the read voltage values of the word lines WL1 to WL29, and by using the line 612, it is possible to linearly calculate the read voltage values of the word lines WL31 to WL58.

In an embodiment, a line 613 is drawable by connecting the read voltage value 604 and the read voltage value 605, and a line 614 is drawable by connecting the read voltage value 605 and the read voltage value 606. By using the line 613, it is possible to linearly calculate the read voltage values of the word lines WL61 to WL89, and by using the line 614, it is possible to linearly calculate the read voltage values of the word lines WL91 to WL118.

As illustrated in FIG. 6, when there are many optimal values 601 to 606 already known, more lines 611 to 614 are drawable, thereby, in an embodiment, more precisely calculating the optimal read voltage values of the word lines.

FIG. 7 is a diagram illustrating an embodiment of a process by which the memory device calculates optimal read voltage values.

Referring to FIG. 7, first, already known optimal read voltage values are read (701). During an initialization operation of the memory device 100, information stored in the CAM area of the memory cell array 110 are read and transmitted to the control logic 140, this information including the already known optimal read voltage values. The optimal read voltage values are information such as the values 401, 403, 405, and 407 in FIG. 4, the values 501, 503, 505, and 507 in FIG. 5, and the values 601 to 606 in FIG. 6. Such values are information measured during the manufacturing process of the memory device 100 and stored in the CAM area.

In an embodiment, the control logic 140 calculates optimal read voltage values of remaining word lines by using the already known optimal read voltage values (703). This calculation process is performed like the methods described with reference to FIGS. 4 to 6. That is, by using the already known optimal read voltage values of some word lines, the optimal read voltage values of the remaining word lines are linearly calculated.

In an embodiment, various read voltages are used in the memory device 100. For example, one type of read voltage is usable in an SLC type memory that stores 1-bit data per memory cell, but three types of read voltage are usable in an MLC type memory that stores 2-bit data per memory cell. Furthermore, seven types of read voltages are usable in a TLC-type memory that stores 3-bit data per memory cell, and more types of read voltages are usable in memories that store more bits of data per memory cell. The methods for calculating optimal read voltage for each word line described above are usable to calculate each of several types of read voltages.

Figure 8:
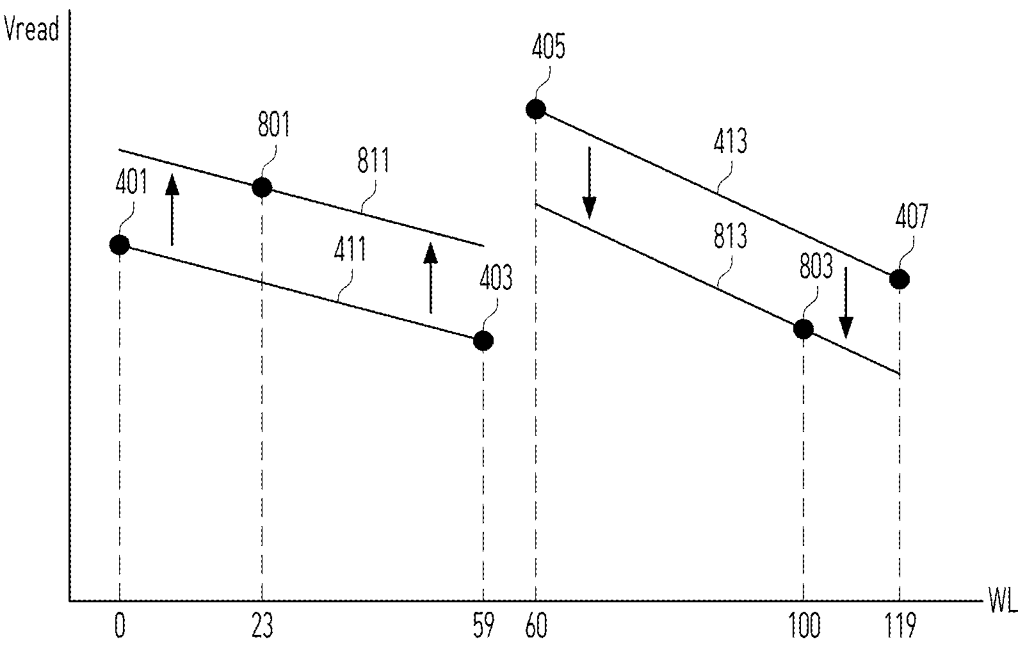
FIG. 8 is a diagram for explaining an embodiment in which an optimal read voltage value is corrected during an operation of the memory device.

FIG. 8 is a diagram for explaining an embodiment in which an optimal read voltage value is corrected during the operation of the memory device. The following describes a case in which the optimal read voltage value is calculated and used in the same manner as illustrated in FIG. 4, and then is corrected.

Referring to FIG. 8, the lines 411 and 413 are drawable using the values 401, 403, 405, and 407, and read voltages of word lines are calculated and used using the lines 411 and 413. The read voltage of the word line WL23 is also calculated and used by the line 411, and an event of correcting the read voltage of the word line WL23 occurs during the operation of the memory device 100. For example, an error occurs during a read operation of memory cells connected to the word line WL23, and a read retry operation is performed, thereby deriving a result that a new value 801 different from the value on the line 411 is more appropriate as the read voltage of the word line WL during the read retry operation. In this case, optimal read voltage values of other word lines of the plug C1, other than the word line WL23, are also linearly corrected. That is, the control logic 140 corrects the existing line 411 to a new line 811. The read retry operation is an operation that re-executes the read process using a modified read voltage In an embodiment, the read voltage of the word line WL100 is calculated and used by the line 413, and an event of correcting the read voltage of the word line WL100 occurs during the operation of the memory device 100. That is, a result that a new value 803 different from the value on the line 413 is more appropriate as the read voltage of the word line WL100 is derived. In this case, optimal read voltage values of other word lines of the plug C2, other than the word line WL100, are also linearly corrected. That is, the control logic 140 corrects the existing line 413 to a new line 813.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A memory device comprising:

a plurality of word lines;

a plurality of memory cells connected to each of the plurality of word lines, respectively;

control logic configured to, based on an optimal read voltage value of a first word line among the plurality of word lines and an optimal read voltage value of a second word line among the plurality of word lines, calculate a linear parameter based on a difference between the optimal read voltage value of the first word line and the optimal read voltage value of the second word line and a positional distance between the first word line and the second word line, and calculate optimal read voltage values of word lines located between the first word line and the second word line by applying the calculated linear parameter; and a row decoder configured to apply the optimal read voltage value calculated by the control logic to a word line located between the first word line and the second word line selected from the plurality of word lines.

2. The memory device of claim 1, wherein, based on the optimal read voltage value of the second word line and an optimal read voltage value of a third word line among the plurality of word lines, the control logic calculates optimal read voltage values of word lines located between the second word line and the third word line by applying the calculated linear parameter; and the third word line is located in an opposite direction to the first word line with respect to the second word line.

3. The memory device of claim 1, wherein the optimal read voltage value of the first word line and the optimal read voltage value of the second word line are stored in a content addressable memory (CAM) area.

4. The memory device of claim 1, wherein plugs in which memory cells connected to the first word line are formed and plugs in which memory cells connected to the second word line are formed are the same.

5. The memory device of claim 1, wherein, when an optimal read voltage value of one of the word lines located between the first word line and the second word line is corrected, the optimal read voltage value of the first word line and the optimal read voltage value of the second word line are modified by applying the calculated linear parameter with respect to the corrected optimal read voltage value.

6. The memory device of claim 5, wherein the optimal read voltage value of the one word line is corrected during a read retry operation on memory cells corresponding to the one word line.

7. The memory device of claim 1, further comprising a voltage generator configured to generate the optimal read voltage value calculated by the control logic and provide the generated optimal read voltage value to the row decoder.

8. A method of operating a memory device, the method comprising:

reading an optimal read voltage value of a first word line;

reading an optimal read voltage value of a second word line;

calculating a linear parameter based on a difference between the optimal read voltage value of the first word line and the optimal read voltage value of the second word line and a positional distance between the first word line and the second word line;

calculating an optimal read voltage value of a third word line located between the first word line and the second word line by applying the calculated linear parameter; and performing a read operation of reading data from memory cells connected to the third word line by using the optimal read voltage value of the third word line.

9. The method of claim 8, wherein the optimal read voltage value of the first word line and the optimal read voltage value of the second word line are stored in a content addressable memory (CAM) area.

10. The method of claim 9, wherein the optimal read voltage value of the first word line and the optimal read voltage value of the second word line are values determined during a manufacturing process of the memory device.

11. The method of claim 8, further comprising:

correcting the optimal read voltage value of the third word line; and modifying the optimal read voltage value of the first word line and the optimal read voltage value of the second word line by applying the calculated linear parameter with respect to the corrected optimal read voltage value.

12. The method of claim 11, wherein the correcting is performed during a read retry operation.

13. The method of claim 8, wherein plugs in which memory cells connected to the first word line are formed and plugs in which memory cells connected to the second word line are formed are the same.

14. The method of claim 8, further comprising:

reading an optimal read voltage value of a fourth word line;

based on the optimal read voltage value of the second word line and the optimal read voltage value of the fourth word line, calculating an optimal read voltage value of a fifth word line located between the second word line and the fourth word line by applying the calculated linear parameter; and performing a read operation of reading data from memory cells connected to the fifth word line by using the optimal read voltage value of the fifth word line, wherein the fourth word line is located in an opposite direction to the first word line with respect to the second word line.

* * * * *